US00RE49803E

(19) United States
(12) Reissued Patent
Miyanami

(10) Patent Number: US RE49,803 E
(45) Date of Reissued Patent: Jan. 16, 2024

(54) METHOD OF MANUFACTURING SEMICONDUCTOR DEVICE, AND SEMICONDUCTOR DEVICE

(71) Applicant: Sony Corporation, Tokyo (JP)

(72) Inventor: Yuki Miyanami, Kanagawa (JP)

(73) Assignee: Sony Group Corporation, Tokyo (JP)

(21) Appl. No.: 16/184,766

(22) Filed: Nov. 8, 2018

Related U.S. Patent Documents

Reissue of:
(64) Patent No.: 7,510,925
Issued: Mar. 31, 2009
Appl. No.: 11/739,792
Filed: Apr. 25, 2007

(30) Foreign Application Priority Data

Apr. 26, 2006 (JP) ..... 2006-121605

(51) Int. Cl.
*H01L 21/337* (2006.01)
*H01L 21/8234* (2006.01)
(Continued)

(52) U.S. Cl.
CPC ..... *H01L 29/7848* (2013.01); *H01L 29/165* (2013.01); *H01L 29/66628* (2013.01); *H01L 29/66636* (2013.01); *H01L 29/7834* (2013.01)

(58) Field of Classification Search
CPC ..... H01L 21/02647; H01L 21/8221; H01L 21/28525; H01L 21/76879; H01L 21/0262;
(Continued)

(56) References Cited

U.S. PATENT DOCUMENTS 6,724,019 B2 * 4/2004 Oda et al. ..... 257/195
7,238,580 B2 * 7/2007 Orlowski ..... H01L 21/28061 257/E21.2
(Continued)

FOREIGN PATENT DOCUMENTS

JP 03-151669 6/1991
JP 08-186257 7/1996
(Continued)

OTHER PUBLICATIONS

Japanese Office Action dated Apr. 22, 2008 for Application No. 2006-121605.

*Primary Examiner* — Tuan H Nguyen
(74) *Attorney, Agent, or Firm* — Michael Best & Friedrich LLP

(57) ABSTRACT

A method of manufacturing a semiconductor device includes: the first step of forming a gate electrode over a silicon substrate, with a gate insulating film; and the second step of digging down a surface layer of the silicon substrate by etching conducted with the gate electrode as a mask. The method of manufacturing the semiconductor device further includes the third step of epitaxially growing, on the surface of the dug-down portion of the silicon substrate, a mixed crystal layer including silicon and atoms different in lattice constant from silicon so that the mixed crystal layer contains an impurity with such a concentration gradient that the impurity concentration increases along the direction from the silicon substrate side toward the surface of the mixed crystal layer.

22 Claims, 5 Drawing Sheets

(51) Int. Cl.
*H01L 21/8238* (2006.01)
*H01L 29/78* (2006.01)
*H01L 29/165* (2006.01)
*H01L 29/66* (2006.01)

(58) Field of Classification Search
CPC ..... H01L 21/02532; H01L 21/0245; H01L 21/02369; H01L 27/0688; H01L 27/11; H01L 29/7848; H01L 29/165; H01L 29/7834; H01L 29/66628; H01L 29/66636
USPC ..... 438/197, 199, 299, 300, 301
See application file for complete search history.

(56) References Cited

U.S. PATENT DOCUMENTS 8,017,487 B2 * 9/2011 Chong ..... H01L 21/823807
257/E21.43
2007/0004123 A1 * 1/2007 Bohr ..... H01L 21/30608
438/230

FOREIGN PATENT DOCUMENTS

| | | | |
|---|---|---|---|
| JP | 2003-031798 | A | 1/2003 |
| JP | 2004-260132 | A | 9/2004 |
| JP | 2007-165665 | | 6/2007 |
| WO | WO-2005-112577 | | 12/2005 |
| WO | WO-2005-112577 | A2 | 12/2005 |

* cited by examiner

METHOD OF MANUFACTURING SEMICONDUCTOR DEVICE, AND SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCES TO RELATED APPLICATIONS

*The application is a Reissue Application of Ser. No. 11,739,792, filed Apr. 25, 2007, now U.S. Pat. No. 7,510, 925, issued Mar. 31, 2009.* The present invention contains subject matter related to Japan Patent Application JP 2006-121605 filed with the Japan Patent Office on Apr. 26, 2006, the entire contents of which being incorporated herein by reference.

BACKGROUND OF THE INVENTION

1. Field of the Invention

The present invention relates to a method of manufacturing a semiconductor device and the semiconductor device, particularly to a MOS (Metal Oxide Semiconductor) type field effect transistor.

2. Description of the Related Art

In recent years, for the purpose of enhancing the performance of transistors, impressing of a stress on a channel region so as to increase the drain current has been investigated. Examples of the stress impressing method include a method in which a highly stressed film is formed after the formation of a gate electrode so as to impress a stress on a channel region, and a process in which the source/drain regions of a P-channel MOS type field effect transistor (PMOSFET) are etched, and a silicon-germanium (SiGe) layer is epitaxially grown in the etched areas to exert a stress on a channel region.

The application of a stress to the channel region is more effective as the SiGe layer is closer to the channel region and as the volume of the SiGe layer is greater. Furthermore, while the source/drain regions are formed generally by ion implantation, addition of an impurity such as boron simultaneously with the epitaxial growth of the SiGe layer has also been investigated as a method of forming the source/drain regions of a PMOSFET (refer, for example, to JP-A-2002-530864, refer, particularly, to FIG. 4 and paragraph No. 0030).

Here, the above-mentioned method of manufacturing a PMOSFET will be described referring to FIGS. [4A to 4C] *3A to 3C*. First, as shown in FIG. [4A] *3A*, device isolation regions (omitted in the figure) are formed on the face side of a silicon substrate 11. Next, a gate electrode 13 is formed over the silicon substrate 11, with a gate insulating film 12 therebetween, and an offset insulating film 14 including a silicon nitride film is formed on the gate electrode 13. Subsequently, a silicon nitride film is formed over the silicon substrate 11 in the state of covering the gate insulating film 12, the gate electrode 13 and the offset insulating film 14, and the silicon nitride film is etched back by a dry etching method, whereby side walls 15 are formed on both lateral sides of the gate insulating film 12, the gate electrode 13 and the offset insulating film 14.

Next, as shown in FIG. [4B] *3B*, the so-called recess etching, i.e., digging down the silicon substrate 11 by etching with the offset insulating film 14 and the side walls 15 as a mask, is conducted to form recess regions 16. Thereafter, a natural oxide film over the surface of the silicon substrate 11 is removed by a cleaning treatment using diluted hydrofluoric acid.

Subsequently, as shown in FIG. [4C] *3C*, a silicon-germanium (SiGe) layer 17 containing a p-type impurity such as boron is epitaxially grown in the recess regions 16, i.e., on the surfaces of the dug-down portions of the silicon substrate 11. The SiGe layer 17 forms the source/drain regions, and the region, beneath the gate electrode 13 and located between the source/drain regions, of the silicon substrate 11 constitutes the channel region 18. The application of a stress to the channel region 18 by the SiGe layer 17 causes a straining (distortion) of the channel region 18, resulting in the formation of a PMOSFET having a sufficient carrier mobility.

SUMMARY OF THE INVENTION

However, the above-mentioned method of manufacturing a semiconductor device has the following problem. As shown in FIG. [5] *4*, the efficiency of impressing the stress by the SiGe layer 17 is higher as the SiGe layer 17 is closer to the region beneath the gate electrode 13 which serves as the channel region 18. However, since the impurity such as boron is added to the SiGe layer 17, the impurity in the SiGe layer 17 would be diffused (diffused regions A) by the heat treating or heating steps carried out in the subsequent steps. This diffusion would cause the short channel effect. In order to prevent such a situation, it may be contemplated to enlarge the distance between the region beneath the gate electrode 13 and the SiGe layer 17 to which boron is added. In that case, however, the stress exerted on the channel region 18 is weakened, so that a sufficient carrier mobility may not be obtained.

Thus, there is a need for a method of manufacturing a semiconductor device, and the semiconductor device, with which the short channel effect can be prevented and a sufficient carrier mobility can be obtained.

According, to an embodiment of the present invention, there is provided a method of manufacturing a semiconductor device, including: the first step of forming a gate electrode, the second step of digging down a surface layer, and the third step of epitaxially growing. The first step is configured to form a gate electrode, over a silicon substrate, with a gate insulating film. The second step is configured to dig down a surface layer of the silicon substrate by etching conducted with the gate electrode as a mask. The third step is configured to epitaxially grow, on the surface of the dug-down portion of the silicon substrate, a mixed crystal layer including silicon and atoms different in lattice constant from silicon so that the mixed crystal layer contains an impurity with such a concentration gradient that the impurity concentration increases along the direction from the silicon substrate side toward the surface of the mixed crystal layer.

According to the method of manufacturing a semiconductor device as just-mentioned, on the surface of the dug-down portion of the silicon substrate, the mixed crystal layer is epitaxially grown so as to contain the impurity with such a concentration gradient that the impurity concentration increases along the direction from the silicon substrate side toward the surface. Therefore, the mixed crystal layer in the vicinity of the channel region, beneath the gate electrode, of the silicon substrate contains the impurity in a lower concentration as compared with that on the surface side. This ensures that the diffusion of the impurity from the mixed crystal layer due to a heat treatment is restrained, and the short channel effect is prevented from being generated. In addition, since it is unnecessary to enlarge the distance between the region beneath the gate electrode and the mixed crystal layer, a sufficient carrier mobility can be obtained.

According to another embodiment of the present invention, there is provided a semiconductor device including: a gate electrode provided over a silicon substrate, with a gate insulating film; and a mixed crystal layer including silicon and atoms different in lattice constant from silicon, in regions where the silicon substrate is dug down on both lateral sides of the gate electrode. The mixed crystal layer contains the impurity with such a concentration gradient that the impurity concentration increases along the direction from the silicon substrate side toward the surface.

According to the semiconductor device as just-mentioned, the mixed crystal layer containing the impurity with a concentration gradient such that the impurity concentration increases along the direction from the silicon substrate side toward the surface. Therefore, the mixed crystal layer in the vicinity of the channel region, beneath the gate electrode, of the silicon substrate contains the impurity in a lower concentration as compared with that on the surface side. This ensures that the diffusion of the impurity from the mixed crystal layer due to a heat treatment is restrained, and the short channel effect is prevented from being generated. In addition, since it is unnecessary to enlarge the distance between the region beneath the gate electrode and the mixed crystal layer, a sufficient carrier mobility can be obtained.

As has been above-mentioned, according to the method of manufacturing a semiconductor device and the semiconductor device which pertain to the present invention, the short channel effect can be prevented from being generated, and a sufficient carrier mobility can be obtained, so that transistor characteristics can be enhanced.

DETAILED DESCRIPTION OF THE PREFERRED EMBODIMENTS

Now, some embodiments of the present invention will be described below, based on the drawings. In each of the embodiments, the configuration of a semiconductor device will be described in the order of manufacturing steps.

First Embodiment

An embodiment of the method of manufacturing a semiconductor device pertaining to the present invention will be described below, taking the method of manufacturing a PMOSFET as an example and referring to the manufacturing step sectional diagrams in FIGS. 1A to 2G. Incidentally, in the following description, the same configurations as those described in the background of the invention above will be denoted by the same symbols as used above.

Figure 1A:
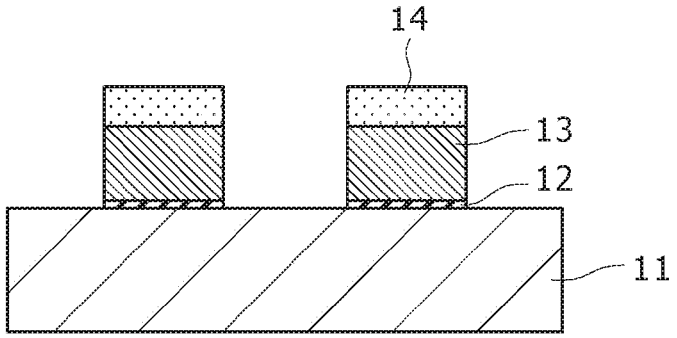
FIGS. 1A to 1G are manufacturing step sectional diagrams for illustrating a first embodiment of the method of manufacturing a semiconductor device pertaining to the present invention.

First, as shown in FIG. 1A, a silicon substrate 11 composed of single crystal silicon is prepared, and device isolation regions are formed on the face side thereof. In this case, for example, device isolation regions of the STI (shallow trench isolation) structure are formed, in which trenches are formed on the face side of the silicon substrate 11, and an insulating film composed of a silicon oxide film, for example, is buried in the trenches.

Next, on the silicon substrate 11 in each area isolated by the device isolation regions, a gate electrode 13 composed of polysilicon, for example, is patterned, with a gate insulating film 12 composed of a silicon oxynitride film, for example, therebetween. In this case, in order that an offset insulating film 14 composed of a silicon nitride film, for example, is provided on the gate electrode 13, films of materials for constituting the gate insulating films 12, the gate electrodes 13 and the offset insulating films 14 are layered in a stacked state, and the stack of films is subjected to pattern etching.

Here, the material constituting the gate insulating film 12 is not limited to the silicon oxynitride film, and may be a silicon oxide film or a metallic oxide film containing hafnium or aluminum. In addition, the gate electrode 13 is not limited to polysilicon, and may contain a metallic material.

Figure 1B:
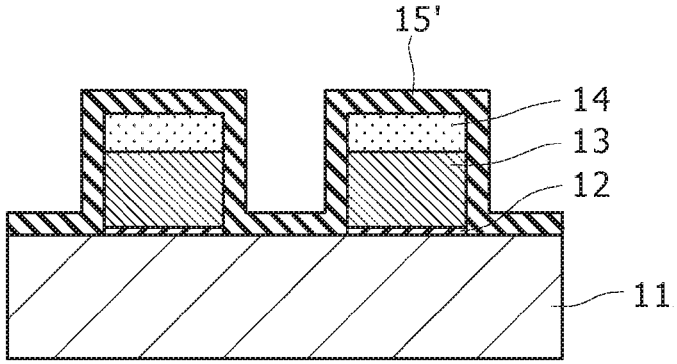
Figure 1C:
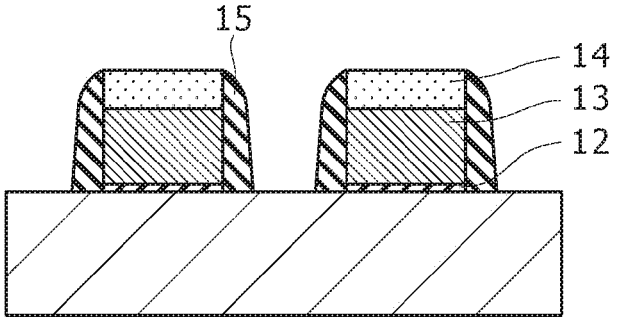

Next, as shown in FIG. 1B, for example, a silicon nitride film 15' is formed over the silicon substrate 11 in the state of covering the gate insulating films 12, the gate electrodes 13, and the offset insulating films 14. Subsequently, as shown in FIG. 1C, the silicon nitride film 15' (see FIG. 1B) is etched back by a dry etching method, for example, whereby insulating side walls 15 are formed on side walls of the gate insulating film 12, the gate electrode 13, and the offset insulating film 14. While the side walls 15 are described to be composed, for example, of silicon nitride film here, the side walls 15 may be composed of other film than the silicon nitride film, and may be configured of silicon oxide film or a stacked structure of these films.

Figure 1D:
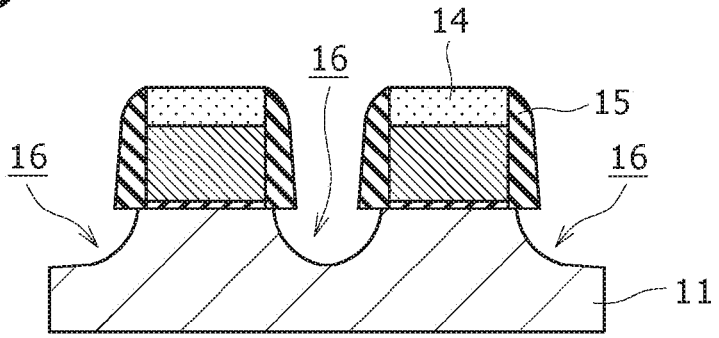

Next, as shown in FIG. 1D, recess etching which includes in digging down the surface of the silicon substrate 11 is conducted. In this case, the recess etching of digging down the surface layer of the silicon substrate 11 is realized by etching which is conducted with use of the offset insulating film 14 on the gate electrode 13 and the side walls 15 as a mask, whereby recess regions 16 about 80 nm deep are formed. In the recess etching, an isotropic etching is conducted, whereby the recess region 16 can be broadened even to the lower side of the side walls 15. Thereafter, a cleaning treatment is conducted using diluted hydrofluoric acid, whereby a natural oxide film on the surface of the silicon substrate 11 is removed. Incidentally, while an example in which the recess etching is conducted in the condition where the side walls 15 have been provided is described here, the present invention is applicable also to the case where the recess etching is carried out without the side walls 15 provided in advance.

Subsequently, a mixed crystal layer containing silicon and atoms different in lattice constant from silicon is epitaxially grown, in an impurity-containing state, on the surfaces of the recess regions 16, i.e., on the surfaces of the dug-down portions of the silicon substrate 11. Here, an SiGe layer (mixed crystal layer) composed of silicon (Si) and atoms (Ge) larger than silicon in lattice constant and containing, for example, boron as an impurity is epitaxially grown, in view of the PMOSFET intended to be produced.

In this case, as a characteristic feature of the present invention, on the surfaces of the dug-down portions of the silicon substrate 11, the SiGe layer is epitaxially grown so as to contain boron with such a concentration gradient that the boron concentration therein increases along the direction from the side of the silicon substrate 11 toward the surface thereof. Here, the SiGe layer is composed of a first SiGe layer (first layer), a second SiGe layer (second layer) and a third SiGe layer (third layer) which are sequentially layered in a stacked state.

Figure 1E:
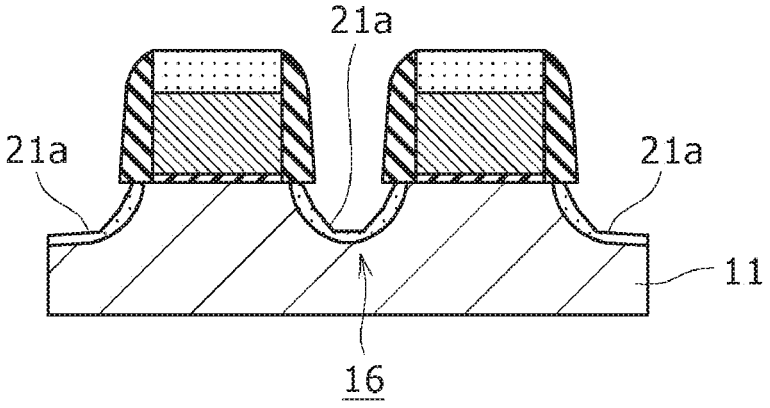

Specifically, as shown in FIG. 1E, on the surfaces of the dug-down portions of the silicon substrate 11, i.e., on the surfaces of the recess regions 16, the first SiGe layer 21a is formed so as to contain boron in the lowest concentration among the three SiGe layers. Here, the first SiGe layer 21a is epitaxially grown in a film thickness of one to 30 nm so as to obtain a boron concentration of $1\times10^{18}$ to $1\times10^{19}$ $cm^{-3}$.

As for the film forming conditions for the first SiGe layer 21a, dichlorosilane (DCS), germanium hydride ($GeH_4$) diluted with hydrogen ($H_2$) to 1.5 vol %, hydrogen chloride (HCl), and diborane ($B_2H_6$) diluted with hydrogen ($H_2$) to 100 ppm are used as film-forming gases, at gas flow rates of DCS/$GeH_4$/HCl/$B_2H_6$=ten to 100/ten to 100/ten to 100/one to 50 (ml/min), a treating temperature of 650 to 750° C., and a treating pressure of 1.3 to 13.3 kPa. It is to be noted that the gas flow rates are volume flow rates in the normal state, here and hereinafter.

Here, the first SiGe layer 21a containing the impurity in the low concentration is located closer to the channel region, as compared with the second and third SiGe layers; therefore, diffusion of boron from the SiGe layer due to a heat treatment is restrained, and the short channel effect is prevented from being produced. Besides, in order to securely prevent the short channel effect, the film thickness of the first SiGe layer 21a in the above-mentioned range is further preferably in the range of ten to 30 nm, within such a range as not to lower the carrier mobility in the PMOSFET produced.

Incidentally, as has been described in the background of the invention above, there may be cases where an SiGe layer containing an impurity in a low concentration is formed on the surfaces on the recess regions, for convenience of film formation, even in the case of directly forming the SiGe layer on the surfaces of the recess regions without changing the film forming conditions. The formation of the first SiGe layer 21a in this embodiment, however, is different from such an incidental case. Specifically, the first SiGe layer 21a containing the impurity in the low concentration is formed so as to have a predetermined film thickness, by positively changing the film forming conditions.

Figure 1F:
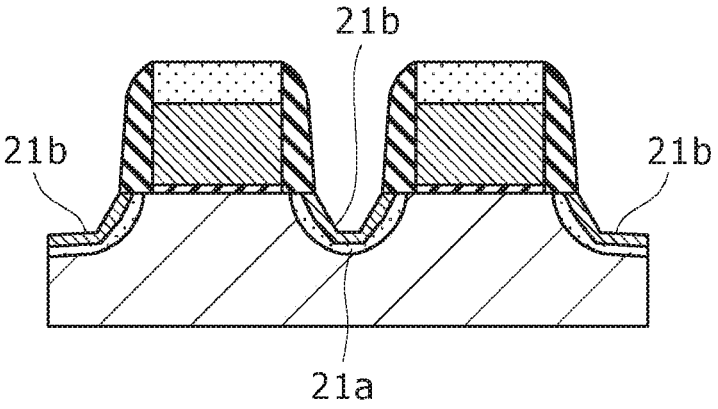

Next, as shown in FIG. 1F, on the first SiGe layer 21a, the second SiGe layer 21b is epitaxially grown so as to contain the impurity with such a concentration gradient that the impurity concentration therein varies continuously from the impurity concentration in the first SiGe layer 21a to the impurity concentration in the third SiGe layer which will be described later, along the direction from the first SiGe layer 21a side toward the surface thereof. Here, in view of that the boron concentration in the first SiGe layer 21a is in the range of $1\times10^{18}$ to $1\times10^{19}$ $cm^{-3}$ and that the boron concentration in the third SiGe layer is in the range of $1\times10^{19}$ to $5\times10^{20}$ $cm^{-3}$, the second SiGe layer 21b is so formed as to contain boron with such a concentration gradient that the boron concentration therein varies continuously from the range of $1\times10^{18}$ to $1\times10^{19}$ $cm^{-3}$ to the range of $1\times10^{19}$ to $5\times10^{20}$ $cm^{-3}$, along the direction from the first SiGe layer 21a side toward the surface thereof. The film thickness of the second SiGe layer 21b is one to 20 nm.

As for the film forming conditions for the second SiGe layer 21b, the same film-forming gases as those in the case of the first SiGe layer 21a are used. Of the film-forming gases, DCS, $GeH_4$, and HCl are used at gas flow rates of DCS/$GeH_4$/HCl=ten to 100/ten to 100/ten to 100 (ml/min). Besides, the gas flow rate of $B_2H_6$ diluted by $H_2$ to 100 ppm is varied continuously from a value of one to 50 ml/min to a value of 50 to 300 ml/min. In addition, the treating temperature is set in the range of 650 to 750° C., and the treating pressure is in the range of 1.3 to 13.3 kPa.

Here, the configuration in which the second SiGe layer 21b as above is interposed between the first SiGe layer 21a being the lowest of the three SiGe layers in impurity concentration and the third SiGe layer being the highest of the three SiGe layers in impurity concentration moderates the trouble in film formation due to the difference in impurity concentration between the first SiGe layer 21a and the third SiGe layer. Therefore, the second SiGe layer 21b may not necessarily be provided in the case where the difference in impurity concentration between the first SiGe layer 21a and the third SiGe layer is small. In addition, while the second SiGe layer 21b is here formed so as to contain the impurity in such a concentration gradient that the impurity concentration therein varies continuously along the direction from the side of the first SiGe layer 21a toward the side of the third SiGe layer, the concentration variation may be stepwise. In that case, the $B_2H_6$ gas flow rate is changed stepwise.

Figure 1G:
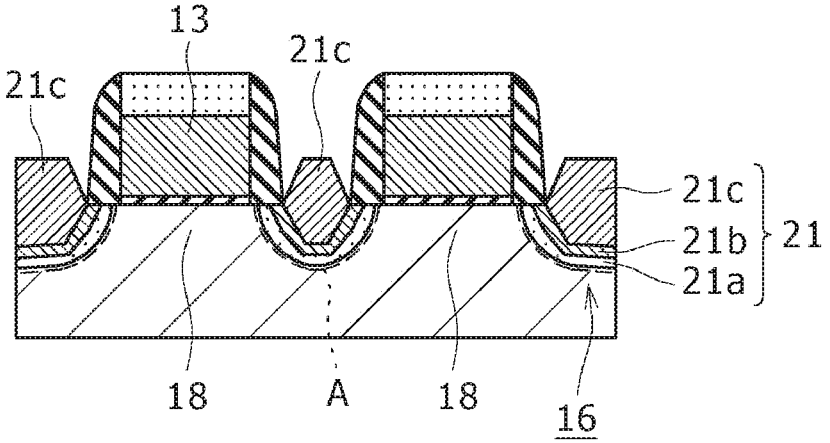

Next, as shown in FIG. 1G, on the second SiGe layer 21b, the third SiGe layer 21c is formed so as to contain the impurity in the highest concentration among the three SiGe layers. Here, the third SiGe layer 21c is epitaxially grown to a film thickness of 50 to 100 nm so as to have a boron concentration of $1\times10^{19}$ to $5\times10^{20}$ $cm^{-3}$.

As for the film forming conditions for the third SiGe layer 21c, the same film-forming gases as those in the cases of the first SiGe layer 21a and the second SiGe layer 21b are used at gas flow rates of DCS/$GeH_4$/HCl/$B_2H_6$=ten to 100/ten to 100/ten to 100/50 to 300 (ml/min), a treating temperature of 650 to 750° C., and a treating pressure of 1.3 to 13.3 kPa.

As a result, the SiGe layer 21 composed of the first SiGe layer 21a, the second SiGe layer band the third SiGe layer 21c which are sequentially layered in a stacked state is formed on the surfaces of the recess regions 16. Since the recess regions 16 are formed to be about 80 nm deep, the recess regions 16 are filled sequentially with the first SiGe layer 21a, the second SiGe layer 21b and the third SiGe layer 21c, and the third SiGe layer 21c is in the state of being protuberant upward from the surface level of the silicon substrate 11. In addition, the SiGe layer 21 contains boron as an impurity with such a concentration gradient that the impurity concentration therein increases along the direction from the side of the silicon substrate 11 toward the surface thereof.

The SiGe layers 21 form the source/drain regions of the PMOSFET manufactured by the manufacturing method according to this embodiment, and the region of the silicon substrate 11 beneath the gate electrode 13 located between the SiGe layers 21 becomes the channel region 18 of the PMOSFET.

The subsequent steps are carried out in the same manner as in the usual PMOSFET manufacturing method. For example, the face side of the SiGe layer 21 may be silicided to form a silicide layer. In this case, since the first SiGe layers 21a located close to the channel region 18 contain the impurity in the low concentration as above-mentioned, diffusion A of the impurity is restrained even when a heat treatment is conducted after the formation of the SiGe layer 21, and, therefore, the short channel effect is prevented from being generated.

In this manner, a PMOSFET in which the channel region 18 is strained by the stress (compressive stress) imposed on the channel region 18 by the SiGe layers 21 is manufactured.

According to the method of manufacturing a semiconductor device and the semiconductor device as above-described, the SiGe layer 21 is epitaxially grown so as to contain the impurity with such a concentration gradient that the impurity concentration therein increases along the direction from the side of the silicon substrate 11 toward the surface thereof, so that the diffusion A of the impurity from the SiGe layer 21 due to a heat treatment is restrained, and the short channel effect is prevented from being generated. Particularly, according to this embodiment, the SiGe layer 21 is composed of the three SiGe layers, and the first SiGe layer 21a close to the channel region 18 is formed so as to contain the impurity in a lower concentration as compared with the other SiGe layers, so that the short channel effect can be securely prevented from being produced. In addition, since it is unnecessary to enlarge the distance between the SiGe layer 21 and the region beneath the gate electrode, a sufficient carrier mobility can be obtained. Therefore, transistor characteristics can be enhanced.

Furthermore, according to the method of manufacturing a semiconductor device in this embodiment, the SiGe layer 21 having the impurity concentration gradient can be formed by a series of operations in which only the film forming conditions are changed, without changing the kinds of the film-forming gases, which is excellent on a productivity basis.

Incidentally, while an example in which boron is contained as an impurity in the SiGe layer forming the source/drain regions of the PMOSFET has been described in the first embodiment above, other impurities than boron may be used, for example, gallium (Ga) or indium (In). For example, in the case of using Ga as the impurity, triethylgallium ($Ga(C_2H_5)_3$) or trimethylgallium ($Ga(CH_3)_3$) is used as a film-forming gas, in place of $B_2H_6$ used in the first embodiment above. Similarly, in the case of using In as the impurity, triethylindium ($In(C_2H_5)_3$) or trimethylindium ($In(CH_3)_3$) is used, in place of $B_2H_6$, as a film-forming gas.

Second Embodiment

While the method of manufacturing a PMOSFET has been taken as an example in the description of the first embodiment above, in this embodiment a method of manufacturing an NMOSFET is taken as an example and description thereof will be made referring to FIGS. 2A to 2C. Incidentally, the steps up to the step of digging down the surface of a silicon substrate 11 are carried out in the same manner as the steps described referring to FIGS. 1A to 1D above.

Figure 2A:
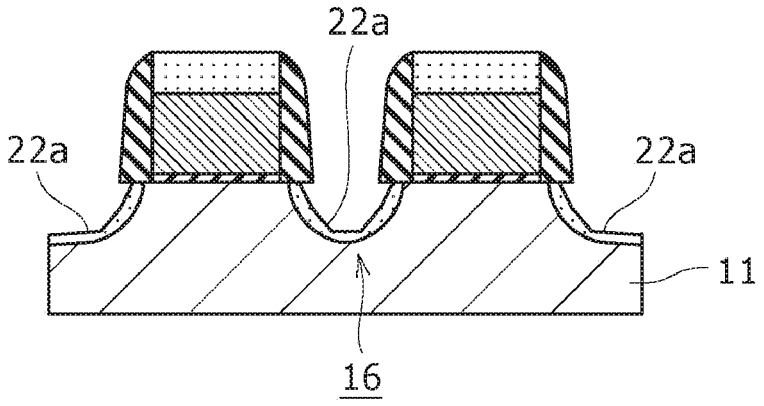
FIGS. 2A to 2C are manufacturing step sectional diagrams for illustrating a second embodiment of the method of manufacturing a semiconductor device pertaining to the present invention.

In the case of manufacturing an NMOSFET, first, as shown in FIG. 2A, a silicon-carbon (SiC) layer (mixed crystal layer) composed of silicon (Si) and atoms (C) smaller in lattice constant than silicon and containing, for example, arsenic (As) as an impurity is epitaxially grown on the surfaces of recessed regions 16, i.e., on the surfaces of the dug-down portions of the silicon substrate 11.

In this case, also, the SiC layer is epitaxially grown so as to contain As with such a concentration gradient that the As concentration therein increases along, the direction from the side of the silicon substrate 11 toward the surface thereof. Here, like in the first embodiment, the SiC layer is composed of a first SiC layer (first layer), a second SiC layer (second layer) and a third SiC layer (third layer) which are sequentially layered in a stacked state.

Specifically, on the surfaces of the dug-down portions of the silicon substrate 11, the first SiC layer 22a is formed so as to be the lowest of the three SiC layer in impurity concentration. Here, the first SiC layer 22a is formed in a film thickness of one to 30 nm so as to have an As concentration of $1\times10^{18}$ to $1\times10^{19}$ $cm^{-3}$.

As for the film forming conditions for the first SiC layer 22a, DCS, monomethylsilane ($SiH_3CH_3$) diluted with hydrogen ($H_2$) to one vol %, HCl, and arsenic hydride ($AsH_3$) diluted with hydrogen to one vol % are used as film-forming gases, at gas flow rates of $DCS/SiH_3CH_3/HCl/AsH_3$=ten to 100/one to 50/ten to 100/one to 25 (ml/min), a treating temperature of 650 to 750° C., and a treating pressure of 1.3 to 13.3 kPa.

Here, as will be described later, the fist SiC layer 22a containing the impurity in the low concentration is disposed to be the closest of the three SiC layers to the channel region, so that diffusion of As from the SiC layer due to a heat treatment is restrained, and the short channel effect is prevented from being produced. Besides, in order to securely prevent the short channel effect, the film thickness of the first SiC layer 22a in the above-mentioned range is further preferably in the range of ten to 30 nm, within such a range as not to lower the carrier mobility in the NMOSFET produced.

Figure 2B:
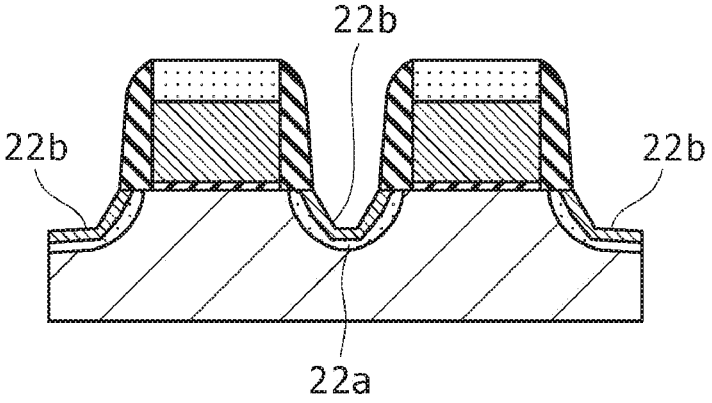

Next, as shown in FIG. 2B, on the first SiC layer 22a, the second SiC layer 22b is formed so as to contain the impurity with such a concentration gradient that the impurity concentration therein varies continuously from the impurity concentration in the first SiC layer 22a to the impurity concentration in the third SiC layer, along the direction from the side of the first SiC layer 22a toward the surface thereof. Here, in view of that the As concentration in the first SiC layer 22a is in the range of $1\times1^{18}$ to $1\times10^{19}$ $cm^{-3}$ and that the As concentration in the third SiC layer is in the range of $1\times10^{19}$ to $5\times10^{20}$ $cm^{-3}$ as will be described later, the second SiC layer 22b is so formed as to contain As with a concentration gradient such that the As concentration therein increases continuously from a value in the range of $1\times10^{18}$ to $1\times10^{19}$ $cm^{-3}$ to a value in the range of $1\times10^{19}$ to $5\times10^{20}$ $cm^{-3}$. The film thickness of the second SiC layer 22b is in the range of one to 20 nm.

As for the film forming conditions for the second SiC layer 22b, the same film-forming gases as in the case of the first SiC layer 22a above are used. Like in the case of the first SiC layer 22a, the gas flow rates of DCS, $SiH_3CH_3$ and HCl are set as $DCS/SiH_3CH_3/HCl$=ten to 100/one to 50/ten to 100 (ml/min). On the other hand, the gas flow rate of $AsH_3$ diluted with $H_2$ to one vol % is varied continuously from a value in the range of one to 25 ml/min to a value in the range of 25 to 50 ml/min. Besides, the treating temperature is set in the range of 650 to 750° C., and the treating pressure in the range of 1.3 to 13.3 kPa.

Here, the configuration in which the second SiC layer 22b as above is interposed between the first SiC layer 22a being the lowest of the three SiC layers in impurity concentration and the third SiC layer being the highest of the three SiC layers in impurity concentration moderates the trouble in film formation due to the difference in impurity concentration between the first SiC layer 22a and the third SiC layer. Therefore, the second SiC layer 22b may not necessarily be provided in the case where the difference in impurity concentration between the first SiC layer 22a and the third SiC layer is small. In addition, while the second SiC layer 22b is here formed so as to contain the impurity in such a concentration gradient that the impurity concentration therein varies continuously along the direction from the side of the first SiC layer 22a toward the side of the third SiC layer, the concentration variation may be stepwise. In that case, the $AsH_3$ gas flow rate is changed stepwise.

Figure 2C:
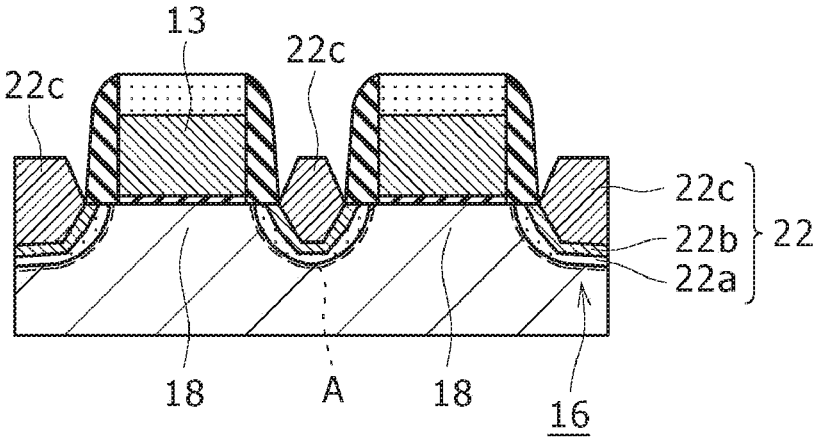
Figure 3A:
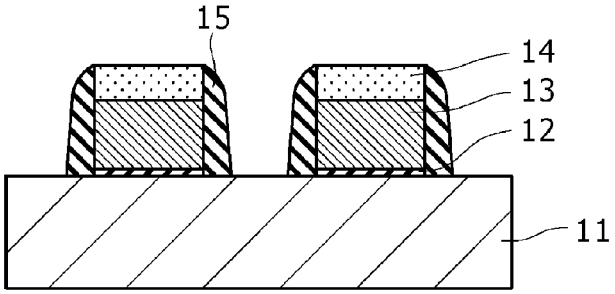
FIG. 3A RELATED ART
FIGS. 3A to 3C are manufacturing step sectional diagrams for illustrating a method of manufacturing a semiconductor device according to the related art.
Figure 3B:
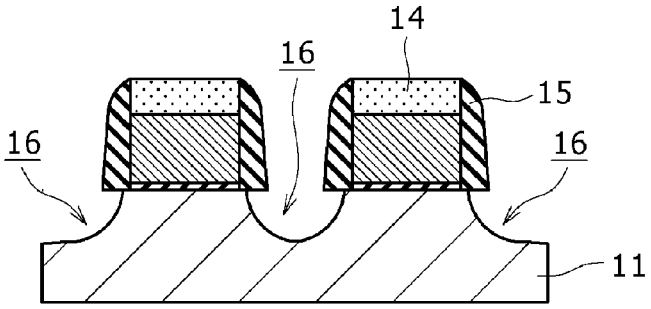
FIG. 3B RELATED ART
Figure 3C:
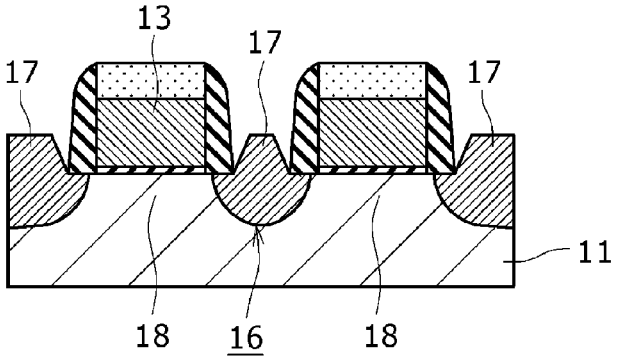
FIG. 3C RELATED ART
Figure 4:
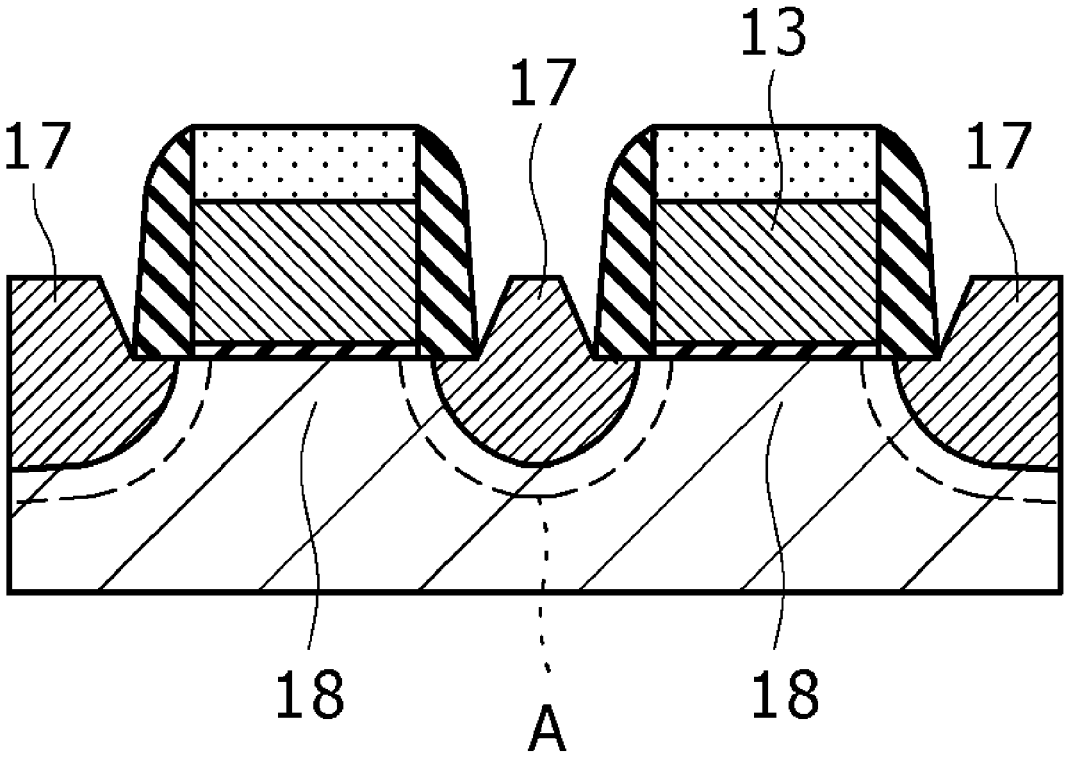
FIG. 4 RELATED ART
FIG. 4 is a sectional diagram for illustrating a problem in the method of manufacturing a semiconductor device according to the related art.

Next, as shown in FIG. 2C, on the second SiC layer 22b, the third SiC layer 22c is formed so as to contain the impurity in the highest concentration among the three SiC layers. Here, the third SiC layer 22c is formed in a film thickness of 50 to 100 nm so as to have an As concentration of $1\times10^{19}$ to $5\times10^{20}$ $cm^{-3}$.

As for the film forming conditions for the third SiC layer 22c, the same film-forming gases as those in the cases of the first SiC layer 22a and the second SiC layer 22b are used at gas flow rates of $DCS/SiH_3CH_3/HCl/AsH_3$=ten to 100/one to 50/ten to 100/25 to 50 (ml/min), a treating temperature of 650 to 750° C., and a treating pressure of 1.3 to 13.3 kPa.

As a result, the SiC layer 22 composed of the first SiC layer 22a, the second SiC layer 22b and the third SiC layer 22c which are sequentially layered in a stacked state is formed on the surfaces of the recess regions 16. Since the recess regions 16 are formed to be about 80 nm deep, the recess regions 16 are filled sequentially with the first SiC layer 22a, the second SiC layer 22b and the third SiC layer 22c, and the third SiC layer 22c is in the state of being protuberant upward from the surface level of the silicon substrate 11. In addition, the SiC layer 22 contains As as an impurity with such a concentration gradient that the impurity concentration therein increases along the direction from the side of the silicon substrate 11 toward the surface thereof.

The SiC layers 22 form the source/drain regions of the NMOSFET manufactured by the manufacturing method according to this embodiment, and the region of the silicon substrate 11 beneath the gate electrode 13 located between the SiC layers 22 becomes the channel region 18 of the NMOSFET.

The subsequent steps are carried out in the same manner as in the usual NMOSFET manufacturing method. For example, the face side of the SiC layer 22 may be silicided to form a silicide layer. In this case, since the first SiC layers 22a located close to the channel region 18 contain the impurity in the low concentration as above-mentioned, diffusion A of the impurity is restrained even when a heat treatment is conducted after the formation of the SiC layer 22, and, therefore, the short channel effect is prevented from being generated.

In this manner, an NMOSFET in which the channel region 18 is strained by the stress (compressive stress) imposed on the channel region 18 by the SiC layers 22 is manufactured.

According to the method of manufacturing a semiconductor device and the semiconductor device as above-described, the SiC layer 22 is epitaxially grown so as to contain the impurity with such a concentration gradient that the impurity concentration therein increases along the direction from the side of the silicon substrate 11 toward the surface thereof, so that the diffusion A of the impurity from the SiC layer 22 due to a heat treatment is restrained, and the short channel effect is prevented from being generated. Particularly, according to this embodiment, the SiC layer 22 is composed of the three SiC layers, and the first SiC layer 22a close to the channel region 18 is formed so as to contain the impurity in a lower concentration as compared with the other SiC layers, so that the short channel effect can be securely prevented from being produced. In addition, since it is unnecessary to enlarge the distance between the SiC layer 22 and the region beneath the gate electrode, a sufficient carrier mobility can be obtained. Therefore, transistor characteristics can be enhanced.

MODIFIED EXAMPLE 1

While an example in which As is contained as an impurity in the SiC layer for forming the source/drain regions of the NMOSFET has been described in the second embodiment above, phosphorus (P) may be used, in place of As, as the impurity.

In this case, also, the first SiC layer 22a is formed in a film thickness of one to 30 nm so as to contain P as the impurity in a concentration in the range of $1\times10^{18}$ to $1\times10^{19}$ $cm^{-3}$.

As for the film forming conditions for the first SiC layer 22a, DCS, $SiH_3CH_3$ diluted with hydrogen ($H_2$) to one vol %, HCl, and phosphorus hydride ($PH_3$) diluted with $H_2$ to 50 ppm are used as film-forming gases, at gas flow rates of $DCS/SiH_3CH_3/HCl/PH_3$=ten to 100/one to 50/ten to 100/one to 150 (ml/min), a treating temperature of 650 to 750° C., and a treating pressure of 1.3 to 13.3 kPa.

Next, on the first SiC layer 22a, a second SiC layer 22b is formed in a film thickness of one to 20 nm so as to contain P as an impurity with such a concentration gradient that the impurity concentration therein increases from a value in the range of $1\times10^{18}$ to $1\times10^{19}$ $cm^{-3}$ to a value in the range of $1\times10^{19}$ to $5\times10^{20}$ $cm^{-3}$, along the direction from the side of the first SiC layer 22a toward the surface thereof.

As for the film forming conditions for the second SiC layer 22b, the same film-forming gases as in the case of the first SiC layer 22a above are used. The gas flow rates of DCS, $SiH_3CH_3$ and HCl are set as $DCS/SiH_3CH_3/HCl$=ten to 100/one to 50/ten to 100 (ml/min). On the other hand, the gas flow rate of $PH_3$ diluted with $H_2$ to 50 ppm varied continuously or stepwise from a value in the range of one to 150 ml/min to a value in the range of 150 to 300 ml/min. Besides, the treating temperature is set in the range of 650 to 750° C., and the treating pressure in the range of 1.3 to 13.3 kPa.

Next, on the second SiC layer 22b, the third SiC layer 22c is formed in a film thickness of 50 to 100 nm so as to contain P as an impurity in a concentration in the range of $1\times10^{19}$ to $5\times10^{20}$ $cm^{-3}$.

As for the film forming conditions for the third SiC layer 22c, the same film-forming gases as those in the cases of the first SiC layer 22a and the second SiC layer 22b are used at gas flow rates of $DCS/SiH_3CH_3/HCl/PH_3$=ten to 100/one to 50/ten to 100/150 to 300 (ml/min), a treating temperature of 650 to 750° C., and a treating pressure of 1.3 to 13.3 kPa.

By the method of manufacturing an NMOSFET and the NMOSFET as just-described, also, the same effects as in the second embodiment above can be displayed.

Incidentally, in the first and second embodiments and the modified example 1 above, descriptions have been made of examples in which the mixed crystal layer composed of a SiGe layer or SiC layer is configured of the first layer, the second layer and the third layer sequentially layered in a stacked state. The first layer and the third layer are each formed to maintain an impurity concentration in a predetermined range, and the second layer is so formed as to have such a concentration gradient that the impurity concentration therein increases continuously from the first layer side toward the third layer side. However, such a configuration is non-limitative of the present invention. For example, the mixed crystal layer may be composed of a plurality of layers containing an impurity with such a concentration gradient that the impurity concentration increases stepwise along the direction from the silicon substrate side toward the surface thereof. Otherwise, the mixed crystal layer may be composed of a single layer containing an impurity with such a concentration gradient that the impurity concentration increases continuously along the direction from the silicon substrate side toward the surface thereof. It should be noted here, however, that the portion, near the channel region, of the mixed crystal layer preferably has a region kept at a low impurity concentration in a film thickness of ten to 30 nm.

In addition, while a method of manufacturing a semiconductor device by which a PMOSFET or NMOSFET is produced has been described in each of the above embodiments, the present invention is applicable also to the case of producing a CMOS (Complementary Metal Oxide Semiconductor) FET in which both a PMOSFET and an NMOSFET are mounted.

It should be understood by those skilled in the art that various modifications, combinations, sub-combinations and alterations may occur depending on design requirements and other factors insofar as they are within the scope of the appended claims or the equivalents thereof.

What is claimed is:

[1. A method of manufacturing a semiconductor device, comprising:

the first step of forming a gate electrode over a silicon substrate, with a gate insulating film;

the second step of digging down a surface layer of said silicon substrate by etching conducted with said gate electrode as a mask; and the third step of epitaxially growing, on the surface of said dug-down portion of said silicon substrate, a mixed crystal layer including silicon and atoms different in lattice constant from silicon so that said mixed crystal layer contains an impurity with such a concentration gradient that the impurity concentration increases along the direction from said silicon substrate side toward the surface of said mixed crystal layer, wherein, said third step includes epitaxially growing said mixed crystal layer so that said mixed crystal layer contains the impurity with said concentration gradient such that said impurity concentration increases stepwise along the direction from said silicon substrate side toward the surface of said mixed crystal layer.]

[2. The method of manufacturing a semiconductor device as set forth in claim 1, wherein said semiconductor device is a p-type field effect transistor, and said third step includes epitaxially growing, on the surface of said silicon substrate, said mixed crystal layer including silicon and germanium so that said mixed crystal layer contains the p-type impurity with said concentration gradient.]

[3. The method of manufacturing a semiconductor device as set forth in claim 1, wherein said semiconductor device is an n-type field effect transistor, and said third step includes epitaxially growing, on the surface of said silicon substrate, said mixed crystal layer including silicon and carbon so that said mixed crystal layer contains the n-type impurity with said concentration gradient.]

[4. The method of manufacturing a semiconductor device as set forth in claim 1, wherein said third step includes epitaxially growing said mixed crystal layer so that said mixed crystal layer contains the impurity with said concentration gradient such that said impurity concentration increases continuously along the direction from said silicon substrate side toward the surface of said mixed crystal layer.]

[5. The method of manufacturing a semiconductor device as set forth in claim 1, wherein said mixed crystal layer includes a first layer, a second layer, and a third layer sequentially layered in a stacked state, and said third step includes the steps of:

forming said first layer on the surface of said dug-down portion of said silicon substrate so that said first layer contains said impurity in the lowest concentration among said three layers;

forming said second layer on said first layer so that said second layer contains said impurity with such a concentration gradient that the impurity concentration in said second layer increases from the impurity concentration in said first layer to the impurity concentration in said third layer; and forming said third layer on said second layer so that said third layer contains said impurity in the highest concentration among said three layers.]

*6. A method of manufacturing a semiconductor device, comprising:*

*a first step of forming a mask, wherein the mask comprises:*

*a first gate electrode over a silicon substrate,*

*a first side wall on a lateral side of the first gate electrode,*

*a second gate electrode over the silicon substrate, and*

*a second side wall on a lateral side of the second gate electrode;*

*a second step of digging down by etching, with the mask, a surface of the silicon substrate in a manner that forms a dug-down portion of the silicon substrate; and*

*a third step of epitaxially growing a mixed crystal layer that includes:*

*silicon and atoms different in lattice constant from silicon so that the mixed crystal layer contains an impurity with such a concentration gradient that a concentration of the impurity increases stepwise along a first direction from the silicon substrate toward a surface of the mixed crystal layer,*

*wherein the mixed crystal layer comprises:*

*a first layer that is grown on a surface of the dug-down portion in a manner that causes the first layer to extend from the first side wall to the second side wall, and*

*a second layer that is grown on the first layer in a manner that causes the second layer to extend from the first side wall to the second side wall,*

*a third layer that is grown on the second layer,*

*wherein a concentration of the impurity in the first layer is lower than a concentration of the impurity in the second layer,*

*wherein the third layer is a topmost layer of the mixed crystal layer, protrudes in the first direction from a surface level of the silicon substrate, and has a film thickness of at least 50 nm.*

*7. The method of manufacturing a semiconductor device as set forth in claim 6, wherein the concentration of the impurity in the second layer is lower than a concentration of the impurity in the third layer.*

*8. The method of manufacturing a semiconductor device as set forth in claim 7, wherein the second layer is between the first layer and the third layer.*

*9. The method of manufacturing a semiconductor device as set forth in claim 7, wherein the third concentration is* $1\times10^{19}$ *to* $5\times10^{20}$ $cm^{-3}$.

*10. The method of manufacturing a semiconductor device as set forth in claim 7, wherein the first layer and the second layer and the third layer are formed by a same film-forming gases with a same flow rate.*

*11. The method of manufacturing a semiconductor device as set forth in claim 7, wherein the film thickness of the third layer is 50 to 100 nm.*

*12. The method of manufacturing a semiconductor device as set forth in claim 6, wherein the mask exposes the surface of the silicon substrate in the second step.*

*13. The method of manufacturing a semiconductor device as set forth in claim 6, wherein etching in the second step is isotropic etching.*

*14. The method of manufacturing a semiconductor device as set forth in claim 6, wherein the impurity is introduced in the third step using in-situ doping.*

*15. The method of manufacturing a semiconductor device as set forth in claim 6, wherein the second concentration varies continuously from the first concentration to the third concentration.*

*16. The method of manufacturing a semiconductor device as set forth in claim 6, wherein the first concentration is* $1\times10^{18}$ *to* $1\times10^{19}$ $cm^{-3}$.

*17. The method of manufacturing a semiconductor device as set forth claim 6, wherein the second concentration has a concentration gradient increasing from (1) a range of* $1\times10^{18}$ *to* $1\times10^{19}$ $cm^{-3}$ *to (2) a range of* $1\times10^{19}$ *to* $5\times10^{20}$ $cm^{-3}$.

*18. The method of manufacturing a semiconductor device as set forth in claim 6, wherein the mixed crystal layer comprises an impurity selected from a group of consisting of boron, arsenic, phosphorus and a combination thereof.*

*19. The method of manufacturing a semiconductor device as set forth claim 6, wherein the semiconductor device is a p-type field effect transistor.*

*20. The method of manufacturing a semiconductor device as set forth in claim 6, wherein the impurity is a p-type impurity.*

*21. The method of manufacturing a semiconductor device as set forth in claim 20, wherein the atoms different in lattice constant from silicon is germanium.*

*22. The method of manufacturing a semiconductor device as set forth in claim 6, wherein the semiconductor device is an n-type field effect transistor.*

*23. The method of manufacturing a semiconductor device as set forth in claim 6, wherein the impurity is an n-type impurity.*

*24. The method of manufacturing a semiconductor device as set forth in claim 23, wherein the atoms different in lattice constant from silicon is carbon.*

*25. The method of manufacturing a semiconductor device as set forth in claim 6, wherein the film thickness of the first layer is 10 to 30 nm.*

*26. The method of manufacturing a semiconductor device as set forth in claim 6, wherein the film thickness of the second layer is 1 to 20 nm.*

*27. The method of manufacturing a semiconductor device as set forth in claim 6, wherein a depth of the dug-down portion is about 80 nm.*

* * * * *